(12) United States Patent
Ballantine et al.

(10) Patent No.: US 6,255,200 B1
(45) Date of Patent: Jul. 3, 2001

(54) POLYSILICON STRUCTURE AND PROCESS FOR IMPROVING CMOS DEVICE PERFORMANCE

(75) Inventors: Arne W. Ballantine, South Burlington, VT (US); Kevin K. Chan, Staten Island, NY (US); Gary L. Langdeau, Burlington; Michael B. Rice, Colchester, both of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/312,943

(22) Filed: May 17, 1999

(51) Int. Cl.$^7$ .................................................. H01L 21/36
(52) U.S. Cl. ................. 438/488; 438/490; 148/DIG. 122
(58) Field of Search ................... 438/488, 490, 438/491, 503, 507, 509; 148/DIG. 122

(56) References Cited

U.S. PATENT DOCUMENTS

| | | |
|---|---|---|
| 3,899,373 | 8/1975 | Antipov . |
| 4,503,807 | 3/1985 | Nakayama et al. . |
| 4,882,299 | 11/1989 | Freeman et al. . |
| 4,963,506 | * 10/1990 | Liaw et al. .................. 148/DIG. 122 |
| 5,089,432 | 2/1992 | Yoo . |
| 5,132,237 | 7/1992 | Matthews . |
| 5,261,960 | 11/1993 | Ozias . |
| 5,525,157 | 6/1996 | Hawkins et al. . |
| 5,552,017 | 9/1996 | Jang et al. . |
| 5,567,476 | 10/1996 | Law et al. . |
| 5,587,338 | * 12/1996 | Tseng ................................ 156/628.1 |
| 5,607,724 | * 3/1997 | Beinglass et al. .................... 427/255 |
| 5,652,166 | 7/1997 | Sun et al. . |
| 5,668,035 | 9/1997 | Fang et al. . |
| 5,783,469 | 7/1998 | Gardner et al. . |
| 5,998,270 | * 12/1999 | Gilmer et al. ......................... 438/287 |

OTHER PUBLICATIONS

Wolf, "Silicon Processing For The VLSI Era", vol. 1, Lattice Press, pp 166–174, 1986.*

* cited by examiner

Primary Examiner—Trung Dang
(74) Attorney, Agent, or Firm—Connolly Bove Lodge & Hutz; William D. Sabo (57) ABSTRACT

A process for depositing polycrystalline silicon, including exposing a semiconductor substrate on which the polycrystalline silicon is to be deposited to a silicon containing gas and a temperature of about 680° C. to about 800° C.

9 Claims, 7 Drawing Sheets

POLYSILICON STRUCTURE AND PROCESS FOR IMPROVING CMOS DEVICE PERFORMANCE

FIELD OF THE INVENTION

The invention relates to processes utilized in semiconductor device manufacturing. In particular, the present invention relates to a process for depositing polycrystalline silicon, especially for forming CMOS devices. The present invention also relates to CMOS device formed according to the method.

BACKGROUND OF THE INVENTION

Chemical vapor deposition (CVD) techniques are utilized in a variety of applications in semiconductor processing operations. Control of CVD processes is becoming increasingly important as semiconductor device sizes decrease and device density increases. It is increasingly being found that small variations in one or more CVD process parameters can translate into physical and operational differences in structures being created by the processes. Additionally, even small differences in resulting structure, which may result from small differences in process parameters can adversely effect or conversely positively effect the final device structure and operation. In fact, even small operational differences can be important.

SUMMARY OF THE INVENTION

The present invention provides a process for depositing polycrystalline silicon. The process includes exposing a semiconductor substrate on which the polycrystalline silicon is to be deposited to a silicon containing gas at a temperature of about 680° C. to about 800° C.

The present invention also provides a semiconductor device formed according to the process.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which.

DETAILED DESCRIPTION OF THE INVENTION

The present invention provides a particular chemical vapor deposition process. The present invention is particularly useful for depositing polycrystalline silicon. Through controlling process parameters in a particular manner, the present invention provides favorable results as compared to known processes for depositing polycrystalline silicon.

A particularly significant parameter the present invention controls is the temperature at which the polycrystalline silicon is deposited. The present invention produces improved results when carrying out the CVD process at particular temperatures. However, other process parameters may also be controlled according to the present invention to provide favorable results.

Among the advantages of the present invention are that it can increase saturated device current of devices incorporating the deposited polycrystalline silicon. This can be achieved at least in part due to the reduction in polysilicon depletion. For example, utilizing the process according to the present invention, PFET saturated device current can be increased by about 5%. Also, utilizing polycrystalline silicon deposited according to the present invention, NFET saturated device current may be increased by about 1 to about 2%. Typically, other device parameters, such as effective line width (Leff), overlap capacitance (COvl) do not exhibit a shift with a process according to the present invention.

Figure 1:
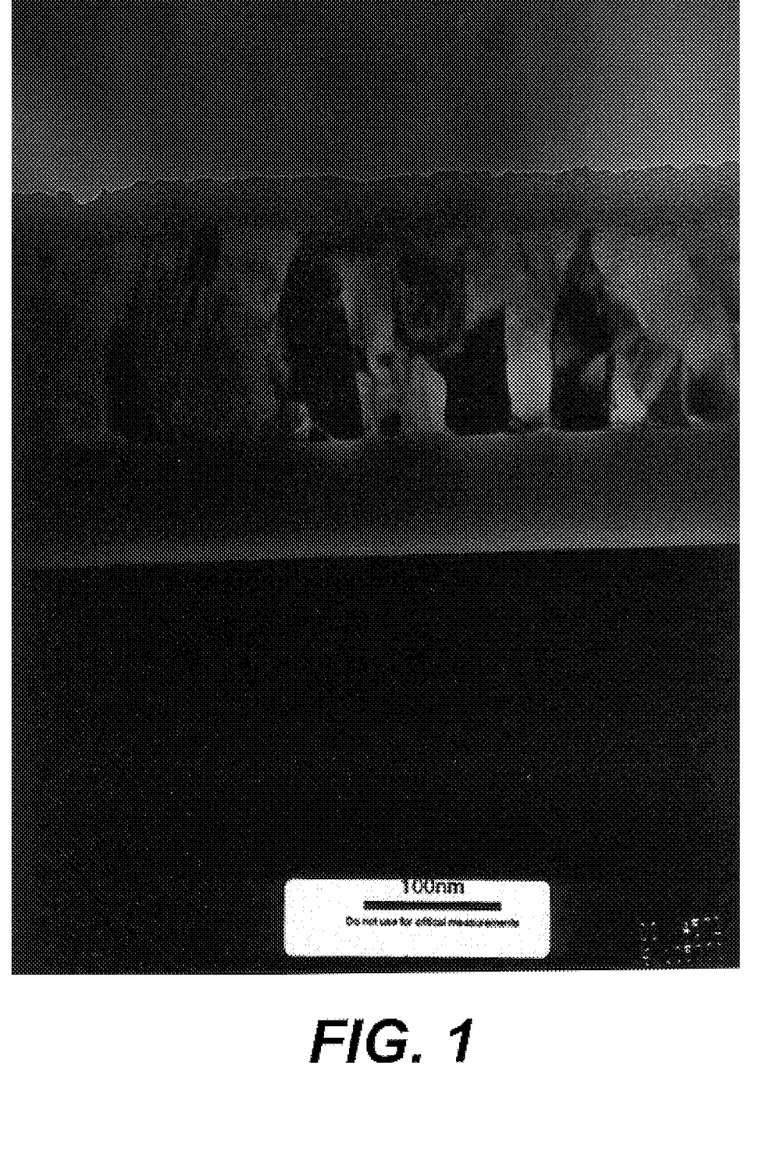
FIG. 1 represents a micrograph of a cross-section of a known structure including polycrystalline silicon deposited at a temperature of about 600° C. to about 630° C. in an LPCVD furnace.

FIG. 1 represents a photomicrograph illustrating polycrystalline silicon formed according to a known process. Along these lines, the polycrystalline silicon film shown in FIG. 1 was deposited in a typical low pressure chemical vapor deposition (LPCVD) furnace deposited at a temperature in a range of about 600° C. to about 630° C. The film in this example is about 1500 Å thick and is deposited on a layer of thermal oxide about 1000 Å thick. The polycrystalline silicon shown in FIG. 1 forms a plurality of individual grains columnar in structure and consistently arranged in this manner throughout the thickness of the film. Each polycrystalline silicon column in this example has an approximate diameter of about 300 Å to about 500Å and a height of about 1500 Å . Typically, in such furnace grown films, the height of the grain columns has a similar dimension as the thickness.

Figure 2:
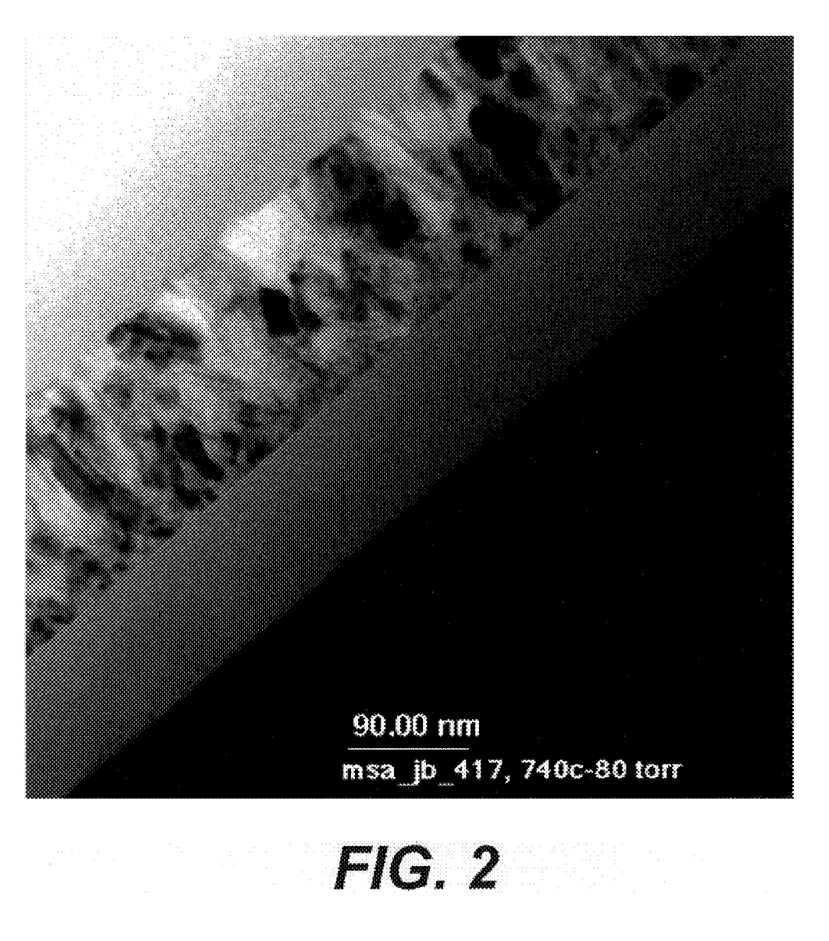
FIG. 2 represents a micrograph of a cross-section of a structure.

In contrast to the structure shown in FIG. 1, FIG. 2 provides a photomicrograph of a structure according to the present invention. As such, FIG. 2 illustrates a typical single wafer Rapid Thermal Chemical Vapor Deposition (RTCVD) grown polysilicon film deposited according to the present invention at a temperature in a range of about 680° C. to about 800° C. The film in this example is about 1500 Å thick and is deposited on a layer of thermal oxide about 1000 Å thick. The grains of polycrystalline silicon in the structure shown in FIG. 2 are equiaxed in structure and vary in size through the depth of the film. Extremely small grains on the order of about 10 Å to about 50 Å are provided at the interface with the thermal oxide. Larger equiaxed grains with a diameter of approximately 200 Å to approximately 400 Å are arranged at the top of the film.

In typical CMOS device processing, an intrinsic polysilicon film, such as the film illustrated in FIG. 1, is deposited on gate dielectric and implanted with N type or P type dopants to form NFET and PFET gates. Depletion typically occurs during device functioning. Depletion is a well known phenomena in all CMOS devices and can be improved by increasing the activated dopant level in the polysilicon film directly above the gate dielectric. Using the process described herein, the depletion region above the gate dielectric on a typical PFET device may be reduced by at least about 1 Å. Also, the NFET depletion may be reduced by at least approximately 0.3 Å.

However, if implant conditions differ from those described herein, polysilicon depletion may present a larger problem. In some cases, the present invention may provide even better results with respect to polysilicon depletion as compared to known processes. Along these lines, depletion could be reduced more than about 0.3 Å or more than about 1 Å.

Also, if structures other than FET's are involved, the depletion values may differ from those stated herein. Along these lines, a MOS structure could be created and the polysilicon biased to create polysilicon depletion but a full FET structure not created. Depletion could be a significant issue in such cases as well. Significantly, the present invention can reduce polysilicon depletion.

The improved polysilicon depletion is achieved by the present invention. One way that the present invention addresses depletion is with single wafer processing. The present invention can produce the composite grain structure described herein. Due to a gradual decrease in grain size in polycrystalline films from the top of the film to an interface with an underlying dielectric, the dopant has an increasing number of grain boundaries to diffuse through. This can improve the diffusivity of the dopant, which may, in turn increase the doping concentration at the critical polysilicon/dielectric interface.

Figure 4:
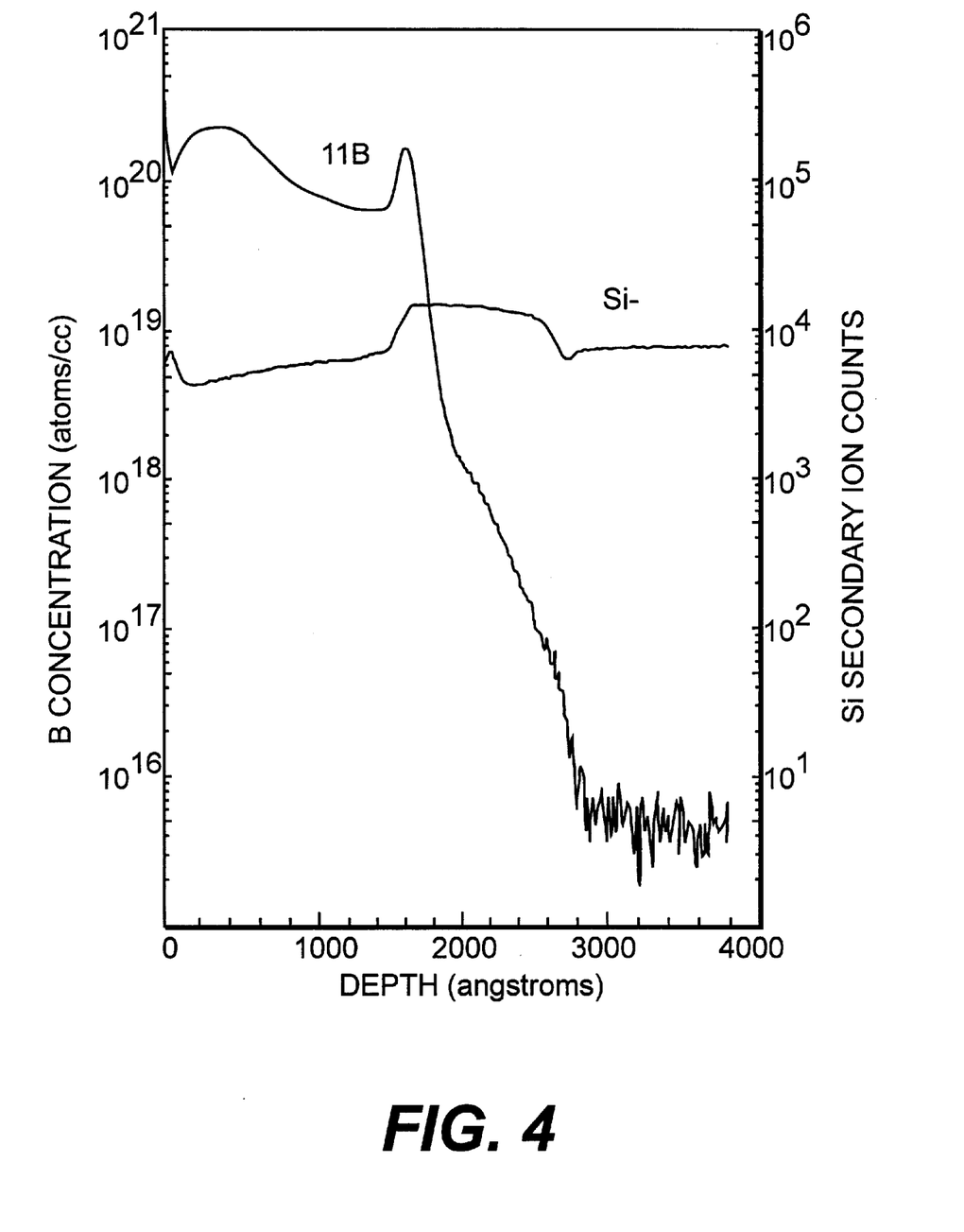
FIG. 4 represents a graph illustrating relationships between depth and boron concentration and silicon secondary ion counts associated with a structure according to the present invention.
Figure 5:
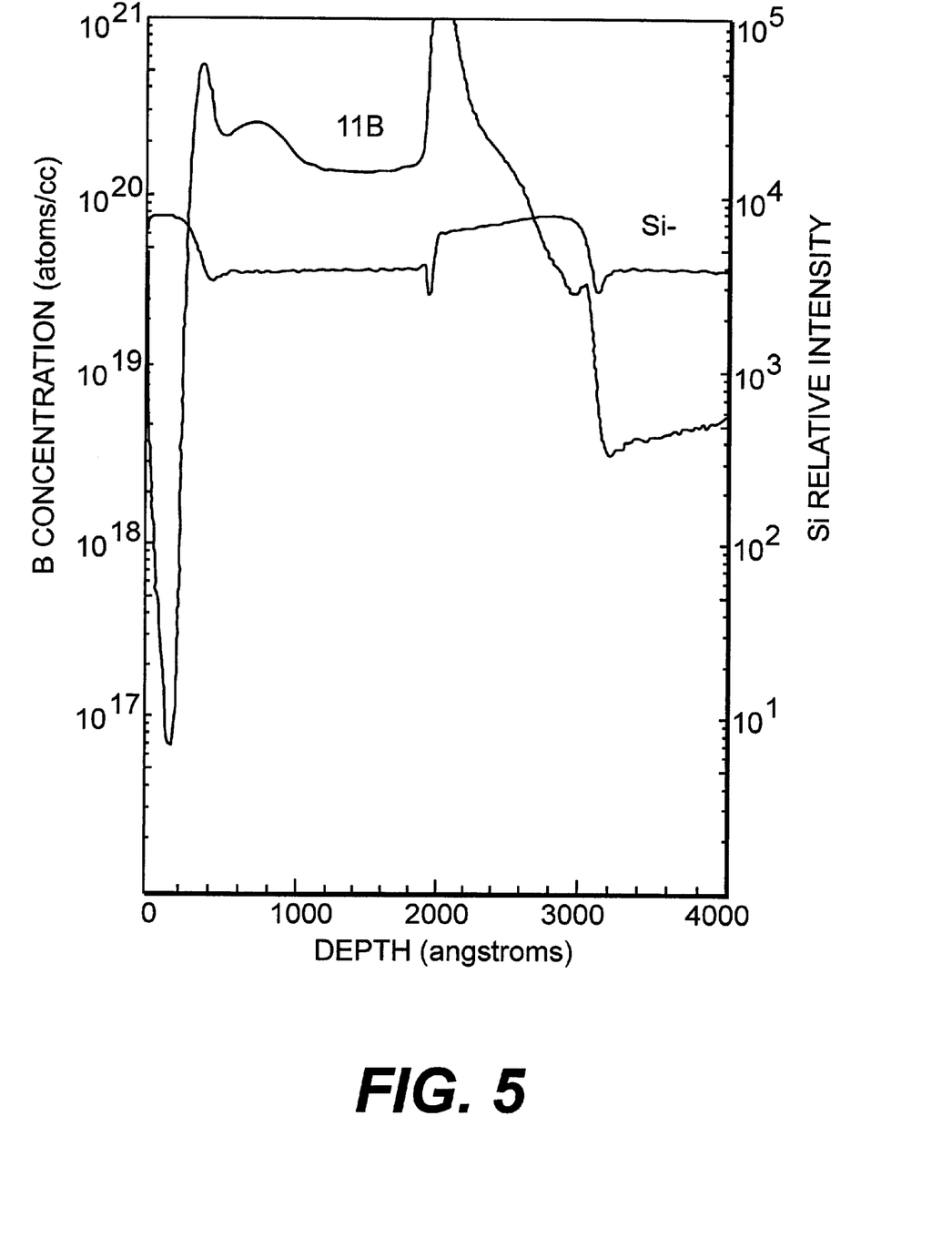
FIG. 5 represents a graph illustrating relationships between depth and boron concentration and silicon relative intensity in a typical LPCVD furnace deposited polycrystalline silicon film.

FIGS. 4 and 5 provide graphs that illustrate the improved depletion characteristics of structures according to the present invention. Along these lines, FIG. 4 represents a Secondary Ion Mass Spectroscopy (SIMS) profile of a polycrystalline silicon film deposited according to typical known LPCVD furnace processes. The polysilicon film was deposited on about 1000 Å of thermal oxide, implanted with Boron at about $3.5 \times 10^{15/10}$ KeV and annealed in an RTP processor at about 1050° C. for about 1 second.

On the other hand, FIG. 5 is polysilicon deposited with a single wafer process according to the present invention on about 1000 Å of thermal oxide and implanted and annealed with similar process parameters as the LPCVD film of FIG. 4. With these similar implant and anneal conditions, the measured doping concentration at the polysilicon/oxide interface (at a depth of about 1500 Å on the X axis of the SIMS profile) of the LPCVD furnace process is about $6 \times 10^{19}$ versus about $1.5 \times 10^{20}$ for the single wafer polysilicon film. This example illustrates that the single wafer polysilicon film grain structure allows dopants such as Boron to move and diffuse more efficiently than common furnace grown films.

Figure 6:
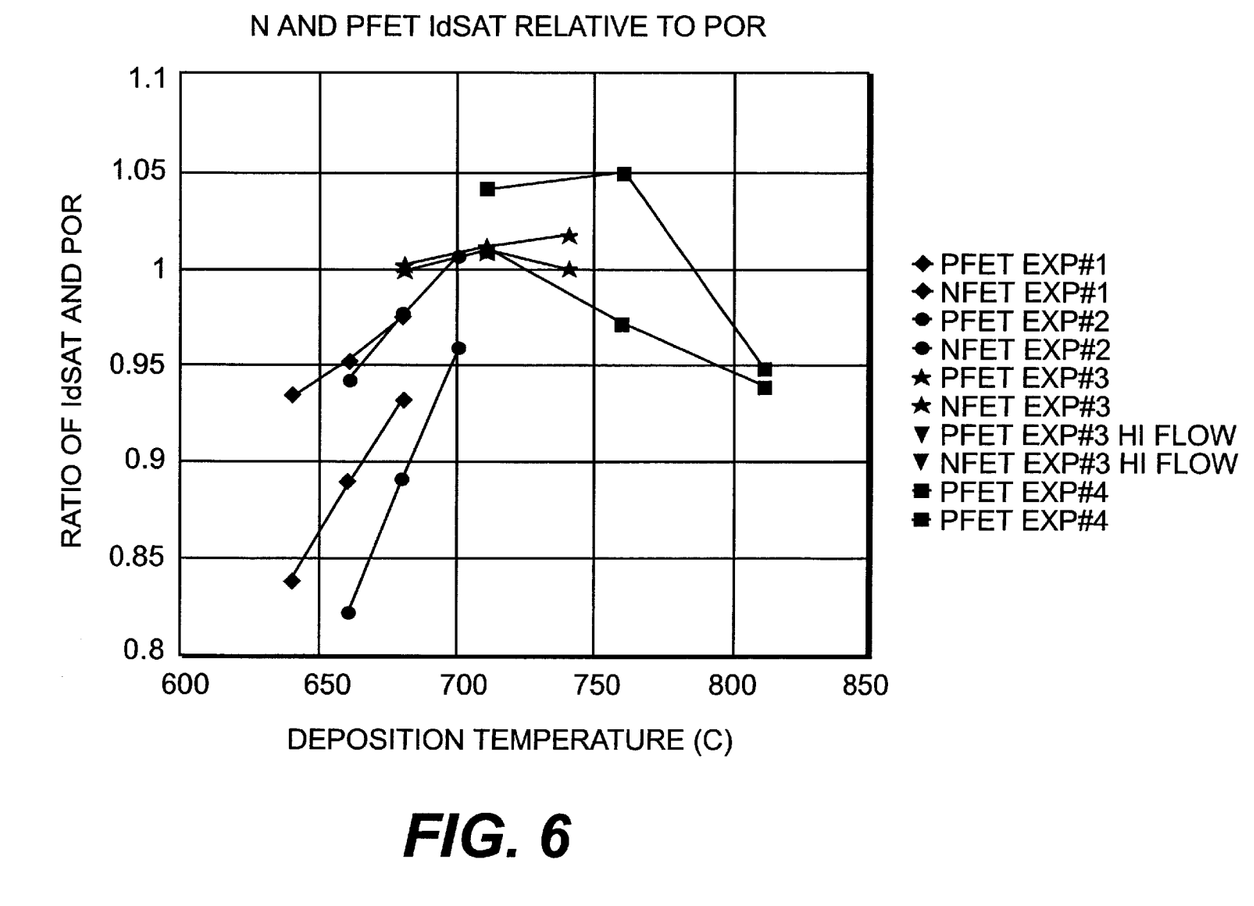
FIG. 6 represents a graph illustrating differences between structures created by processes according to the present invention as compared to known processes.

FIG. 6 provides a graph illustrating a relationship between deposition temperature and percent of the process of record saturated device current (IdSAT). This graph illustrates that as deposition temperature increases, the percent of the process of record (POR), or a known process, increases. Of course, as can be seen in FIG. 6, beyond a certain point, beyond about 740° C., the percent as compared to the process of record starts to decrease.

As can be seen in FIG. 6, in the range of about 710° C. to about 740° C., the percentage with respect to the process of record plateaus and then decreases. Accordingly, depositing the polycrystalline silicon at a temperature range of about 710° C. to about 740° C. may provide superior results.

The grain structures produced by the present invention are superior as compared to polycrystalline silicon structures formed according to known processes for a number of reasons. For example, the grain structures formed according to the present invention may permit more dopants to be incorporated into the grains of polycrystalline silicon.

Figure 7:
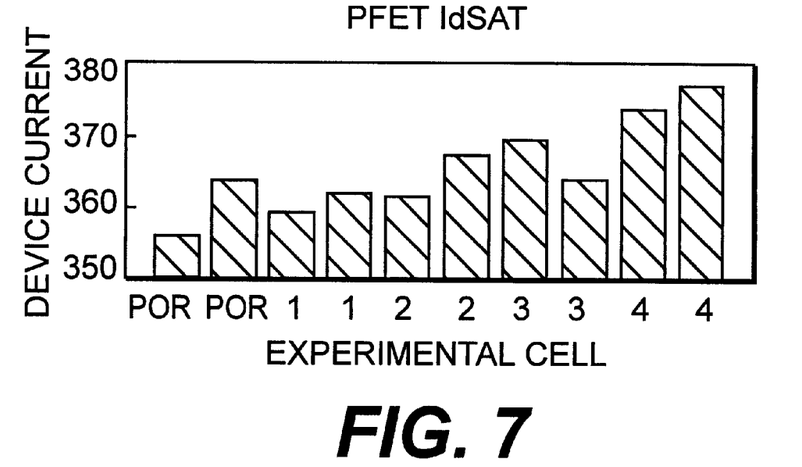
FIG. 7 represents a graph illustrating P-channel FET saturated device current of various structures created utilizing the process according to the present invention as well as known processes.
Figure 8:
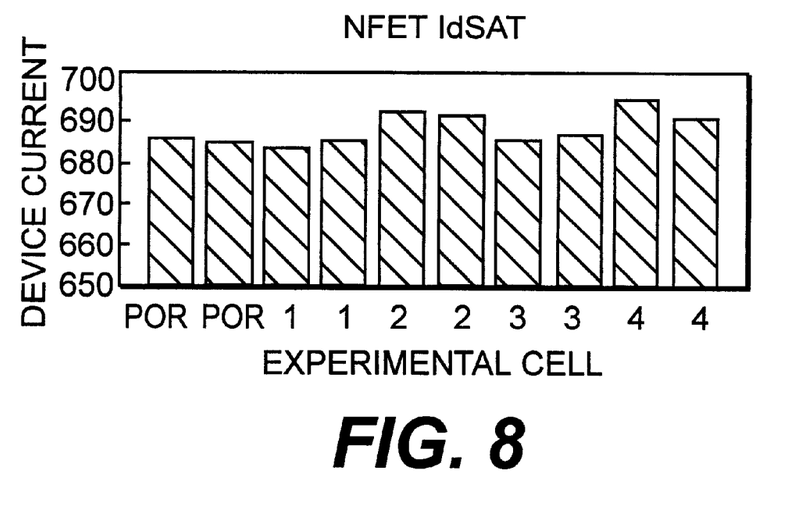
FIG. 8 represents a graph illustrating N-channel saturated device current of various structures created utilizing the process according to the present invention as well as known processes.

FIG. 7 represents graph illustrating saturated device current for various PFET devices including polycrystalline silicon deposited according to a process according to the present invention as well as saturated device current for devices formed according to a known polycrystalline silicon deposition process. FIG. 8 provides a similar graph for NFET devices.

In the graphs shown in FIGS. 7 and 8, the known process, or process of record (POR), utilized a low pressure chemical vapor deposition (LPCVD) furnace. The graphs illustrated in FIGS. 7 and 8 bear out the favorable results in device performance achievable according to the present invention and referred to above.

While the processes of the present invention are discussed below in greater detail, process parameters utilized in creating the structures having the saturated device currents illustrated in FIGS. 7 and 8 are provided here. Cell 1 utilized a process temperature of about 680° C., about 500 sccm $SiH_4$ flow, about 9850 sccm $H_2$ flow, and a pressure of about 80 torr. Cell 2 utilized a process temperature of about 710° C., about 500 sccm $SiH_4$ flow, about 9850 sccm $H_2$ flow, and a pressure of about 80 torr. Cell 3 utilized a process temperature of about 740° C., about 500 sccm $SiH_4$ flow, about 9850 sccm $H_2$ flow, and a pressure of about 80 torr. Cell 4 utilized a process temperature of about 710° C., about 650 sccm $SiH_4$ flow, about 9850 sccm $H_2$ flow, and a pressure of about 80 torr.

Figure 3:
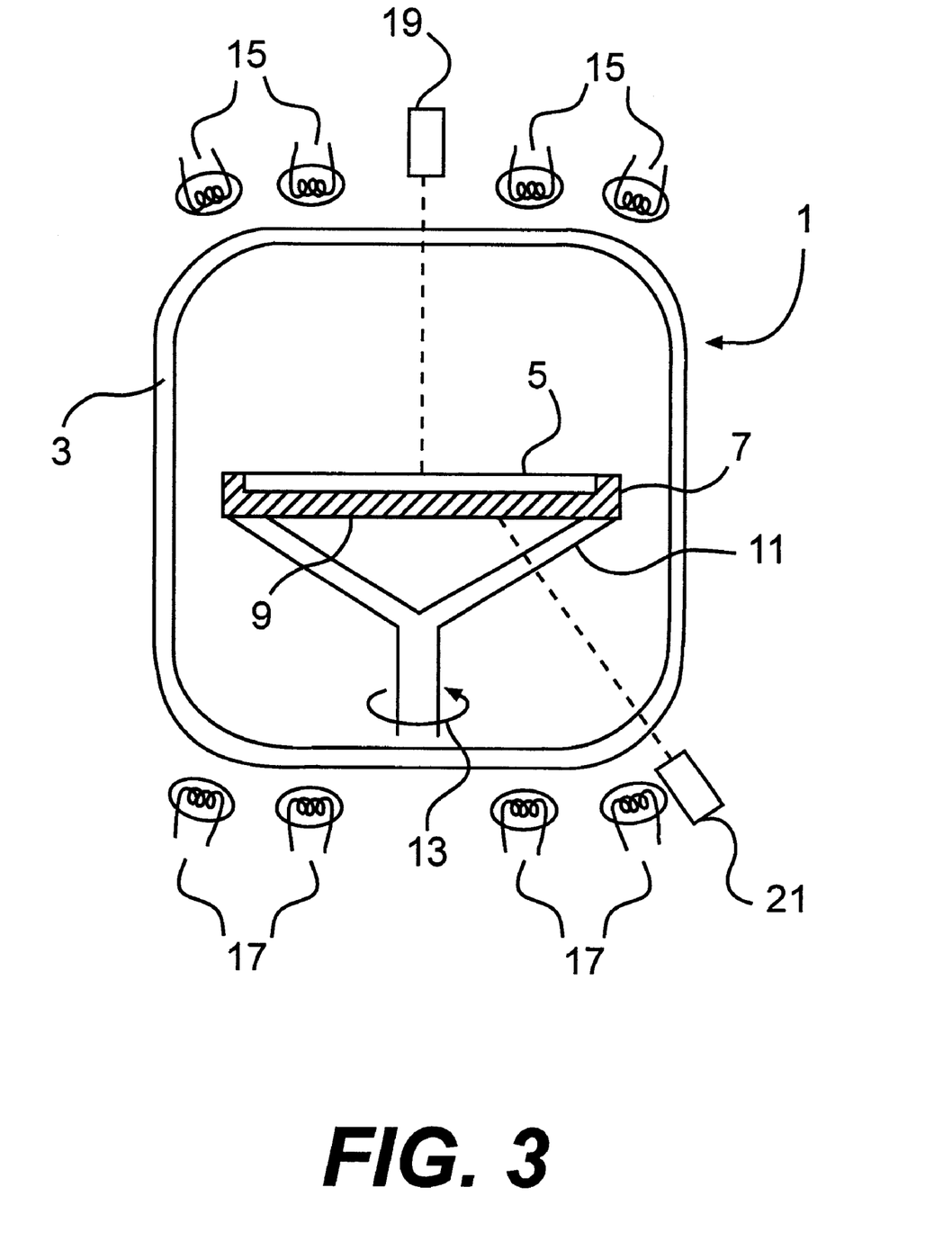
FIG. 3 represents a cross-sectional view of an embodiment of a chemical vapor deposition apparatus that may be utilized for carrying out the process of the present invention.

FIG. 3 illustrates an example of an apparatus that may be utilized to carry out the present invention. The chemical vapor deposition apparatus 1 illustrated in FIG. 3 includes a chamber liner for lining a processing chamber. The chamber liner may be made of quartz.

A substrate 5 to be processed is arranged within the processing chamber. Typically, the substrate is a semiconductor wafer, such as a monocrystalline silicon wafer. Typically, the present invention is utilized in single wafer processing systems. In other words, only a single wafer is arranged within a processing chamber.

A substrate being processed in the chamber may be arranged on a susceptor 9. The susceptor 9 may be supported by support 11. As indicated by arrow 13, the support, susceptor, and substrate being treated may rotate. Rotation is typically carried out in processing to help ensure uniformity of processing. The support, susceptor, and substrate may rotate at a speed of about 10 RPM. However, the support, susceptor, and substrate may rotate at any rate to help ensure uniformity of processing. For example, the rotation rate may be up to about 60 rpm. Typically, the process according to the present invention is carried out on single wafers arranged in an apparatus such as that illustrated in FIG. 3, as opposed to multiple wafer processing.

The interior of the processing chamber may be heated with at least one lamp. Along these lines, at least one lamp may be arranged above and/or below the processing chamber. The embodiment illustrated in FIG. 3 includes a plurality of upper lamps 15 arranged above the processing chamber as well as a plurality of lower lamps 17 arranged below the processing chamber.

Determining whether lamps should be provided above the processing chamber, below the processing chamber or both may depend upon how it is desired the processing be carried out. Typically, the number and arrangement of lamps is designed to help ensure uniform heating of a substrate and processing chamber and also to reduce gas phase nucleation. According to one example, 20 lamps are arranged above the susceptor and 20 lamps are arranged below the susceptor.

The lamps both above and below the chamber may be arranged to further help ensure the desired processing characteristics. For example, in the embodiment described above, which includes 40 lamps, the lamps may be arranged in a circle having a diameter of about 200 mm. The lamps may be further controlled by adjusting the direction that they face. For example, some lamps may be directed toward the center of the susceptor and some may be directed toward the periphery of the susceptor. The lamps could also be directed anywhere between the center and the periphery. According to one particular example, one-half of the lamps are directed toward the center of the susceptor and one-half toward the periphery. The thickness uniformity produced may be tuned by adjusting lamp numbers, arrangement, direction, among other parameters.

For detecting conditions within the processing chamber and the state of the substrate being processed, the present invention may include at least one pyrometer. An apparatus according to the present invention may include at least one pyrometer. The pyrometer may be arranged anywhere about the processing chamber. According to typical embodiments, at least one pyrometer is arranged both above and below processing chamber, similar to the lamps. The embodiment illustrated in FIG. 3 includes an upper pyrometer 19 and a lower pyrometer 21 for detecting conditions within the chamber and the condition of the substrate being processed.

The same process could be deposited in a different chamber than described above. For example, an aluminum, cold wall chamber with a resistively heated susceptor could be used to achieve the same results. These types of chambers are well known in single wafer processing and could be suitable for the process of the present invention.

The process according to the present invention typically includes exposing a semiconductor substrate on which polycrystalline silicon is to be deposited on a silicon-containing gas and a temperature of about 680° C. to about 800° C. According to some embodiments, a process according to the present invention is carried out at a temperature of about 680° C. to about 740° C. According to particular embodiments, the present invention may be carried out at a temperature of about 710° C. Temperatures below about 710° C. may also result in the formation of some amorphous silicon with the polycrystalline silicon.

Other process parameters may be varied according to the process of the present invention. For example, the pressure within the chamber may be controlled. According to typical embodiments, the pressure within the processing chamber is about 15 torr to about 100 torr. According to some particular embodiments, the pressure within the processing chamber is about 20 torr. According to other particular embodiments, the pressure within the processing chamber is about 80 torr. A lower pressure may help to improve conformality and grain structures. In other words, a lower pressure may help to minimize depletion and, therefore, maximize saturated device current.

During processing, the silicon containing gas typically is introduced into the processing chamber. Among the gases that may be utilized as the silicon containing gas is silane gas. Another gas that may also or alternatively be utilized is dichlorosilane (DCS).

The parameters for introducing the gas, such as gas flow rate, may vary. According to particular embodiments, the silicon containing gas is introduced into the processing chamber at a flow rate of about 350 sccm to about 650 sccm. According to one particular embodiment, the silicon containing gas is introduced at a flow rate of about 500 sccm.

In addition to a silicon containing gas, hydrogen may also be introduced into the processing chamber during processing. The hydrogen may act as a carrier gas for the silane or other silicon containing gas.

As with the silicon containing gas, the parameters concerning the hydrogen gas introduction and state within the processing chamber may vary, depending upon the embodiment. According to typical embodiments, the hydrogen is introduced into the processing chamber at a flow rate of about 9850 sccm. The flow rate may vary from about 8000 sccm to about 11000 sccm.

The processing parameters according to the present invention may be varied to control the deposition rate of polycrystalline silicon on the substrate. According to typical embodiments, the process according to the present invention produces a deposition rate of polycrystalline silicon of about 5000 Å per minute to about 6000 Å per minute. According to one particular embodiment, the deposition rate of polycrystalline silicon is about 5217 Å per minute. Once aware of the present disclosure, those of ordinary skill in the art could easily manipulate the process parameters to result in any desired deposition rate.

Another parameter that may be varied according to the present invention is the lamp power distribution above and below the susceptor and/or toward the outer portion and inner portion of the susceptor. The number and arrangement of the lamps may vary. According to one example, 20 lamps are arranged above the susceptor and 20 lamps arranged below the susceptor. Approximately one-half of the lamps in the upper and lower banks are then directed toward the center of the susceptor (inner lamps) and one-half of the lamps are directed to the peripheral of the susceptor (outer lamps).

Typically, the total power to the entire collection of lamps ranges from about 13.1 kilowatts to about 18.5 kilowatts. This total power level may then be split between a collection of upper/inner lamps, upper/outer lamps, lower/inner lamps and/or lower/outer lamps. Typically the upper/inner lamp power may range from about 2.0 kilowatts to about 6.5 kilowatts. The upper/outer lamp power may range from about 3.3 kilowatts to about 9.1 kilowatts. The lower/inner lamp power may range from about 1.2 kilowatts to about 2.6 kilowatts. The lower/outer lamp power may range from about 2.0 kilowatts to about 6.5 kilowatts.

According to one particular embodiment, the process may be carried out at a temperature of about 710° C. The pressure within the processing chamber may be about 80 torr. The silicon containing gas utilized is silane, which may flow into the chamber at a rate of about 500 sccm. According this embodiment, hydrogen is introduced into the processing chamber. The hydrogen is introduced at a rate of about 9850 sccm. The upper/inner lamp power is about 3.8 kilowatts while the upper/outer lamp power is about 5.5 kilowatts. The lower/inner lamp power is about 2.1 kilowatts, while the lower/outer lamp power is about 3.0 kilowatts. The susceptor in this embodiment rotates at about 10 RPM.

Typically, processes according to the present invention operate under a temperature of about 680° C. to about 800° C., utilize a flow of $SiH_4$ of about 350 sccm to about 650 sccm, utilize a flow of $H_2$ of about 7000 sccm to about 11000 sccm, operate under a pressure of about 15 torr to about 100 torr and rotate the susceptor at a rate of about 0 rpm to about 60 rpm. More typically, more favorable results may be obtained operating under a temperature of about 710° C. to about 740° C., utilizing a flow of $SiH_4$ of about 350 sccm to about 500 sccm, utilizing a flow of $H_2$ of about 9850 sccm, operating under a pressure of about 15 torr to about 80 torr and rotating the susceptor at a rate of about 10 rpm to about 30 rpm. One particular example operates under a temperature of about 710° C., utilizes a flow of $SiH_4$ of about 500 sccm, utilizes a flow of $H_2$ of about 9850 sccm, operates under a pressure of about 20 torr and rotates the susceptor at a rate of about 20 rpm. The process may be controlled to control depletion characteristics, saturated device current, among other attributes of a structure.

The present invention may be utilized to deposit polycrystalline silicon for a variety of applications. According to one embodiment, the present invention provides a process for forming a gate of a CMOS device. According to a particular embodiment, this CMOS device is a PFET and the deposit of polycrystalline silicon produces a saturated device current of about 367 $\mu$amps/$\mu$m to about 377 $\mu$amps/$\mu$m. According to another particular embodiment, the present invention is utilized to form a NFET and the deposit of polycrystalline silicon has a saturated device current of about 690 $\mu$amps/$\mu$m to about 700 $\mu$amps/$\mu$m. Both the PFET and NFET polycrystalline silicon were formed at about 710° C., utilizing a flow of $SiH_4$ of about 500 sccm and a flow of $H_2$ of about 9850 sccm, and a pressure of about 80 torr to form a thickness of about 2000 Å.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A process for depositing polycrystalline silicon, comprising:

exposing a semiconductor substrate on which the polycrystalline silicon is to be deposited to a silane gas and a temperature of about 680° C. to about 800° C., wherein the silane gas is introduced in to the processing chamber at a flow rate of about 350 sccm to about 650 sccm.

2. A process for depositing polycrystalline silicon, comprising:

exposing a semiconductor substrate on which the polycrystalline silicon is to be deposited to a silane gas and a temperature of about 680° C. to about 800° C., wherein the silane gas is introduced in to the processing chamber at a flow rate of about 500 sccm.

3. A process for depositing polycrystalline silicon, comprising:

exposing a semiconductor substrate on which the polycrystalline silicon is to be deposited to a silane gas and a temperature of about 680° C. to about 800° C.; and introducing hydrogen gas into the processing chamber at a flow rate of about 9850 sccm.

4. A process for depositing polycrystalline silicon, comprising:

exposing a semiconductor substrate on which the polycrystalline silicon is to be deposited to a silane gas and a temperature of about 680° C. to about 800° C.; and introducing hydrogen gas into the processing chamber at a flow rate of about 10 liters per minute.

5. A process for depositing polycrystalline silicon, comprising:

exposing a semiconductor substrate on which the polycrystalline silicon is to be deposited to a silane gas and a temperature of about 680° C. to about 800° C., wherein the process produces a deposition rate of polycrystalline silicon of about 5000 Å per minute to about 6000 Å per minute.

6. A process for depositing polycrystalline silicon, comprising:

exposing a semiconductor substrate on which the polycrystalline silicon is to be deposited to a silane gas and a temperature of about 680° C. to about 800° C., wherein the process produces a deposition rate of polycrystalline silicon of about 5217 Å per minute.

7. A process for depositing polycrystalline silicon, comprising:

exposing a semiconductor substrate on which the polycrystalline silicon is to be deposited to a silane gas and a temperature of about 680° C. to about 800° C., wherein the process forms a gate of a CMOS device, and wherein the CMOS device is a PFET and the deposited polycrystalline silicon produces a saturated device current of about 367 $\mu$amps/$\mu$m to about 377 $\mu$amps/$\mu$m.

8. A process for depositing polycrystalline silicon, comprising:

exposing a semiconductor substrate on which the polycrystalline silicon is to be deposited to a silane gas and a temperature of about 680° C. to about 800° C., wherein the process forms a gate of a CMOS device, and wherein the CMOS device is a PFET and the deposited polycrystalline silicon produces a saturated device current of about 690 $\mu$amps/$\mu$m to about 700 $\mu$amps/$\mu$m.

9. A process for depositing polycrystalline silicon, comprising:

exposing a semiconductor substrate on which the polycrystalline silicon is to be deposited to a silane gas and a temperature of about 680° C. to about 800° C., wherein susceptibility to polycrystalline silicon depletion is reduced.

* * * * *